(12) United States Patent
Takaku

(10) Patent No.: US 10,109,596 B2
(45) Date of Patent: Oct. 23, 2018

(54) SEMICONDUCTOR DEVICE AND METHOD OF MANUFACTURING THE SAME

(71) Applicant: Toshiba Memory Corporation, Tokyo (JP)

(72) Inventor: Satoru Takaku, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/451,315

(22) Filed: Mar. 6, 2017

(65) Prior Publication Data

US 2017/0287849 A1 Oct. 5, 2017

(30) Foreign Application Priority Data

Mar. 29, 2016 (JP) .................. 2016-065743

(51) Int. Cl.
*H01L 23/552* (2006.01)
*H01L 23/00* (2006.01)
(Continued)

(52) U.S. Cl.
CPC ............ *H01L 23/552* (2013.01); *H01L 21/56* (2013.01); *H01L 21/78* (2013.01); *H01L 23/13* (2013.01);
(Continued)

(58) Field of Classification Search
CPC ....... H01L 23/552; H01L 23/13; H01L 24/73; H01L 21/56; H01L 24/32; H01L 24/83;
(Continued)

(56) References Cited

U.S. PATENT DOCUMENTS 5,561,265 A * 10/1996 Livshits .................. H01L 23/08
174/386
2004/0213973 A1 10/2004 Hara et al.
(Continued)

FOREIGN PATENT DOCUMENTS

JP 2005-286212 A 10/2005
JP 2007-042702 A 2/2007
(Continued)

*Primary Examiner* — David Vu
(74) *Attorney, Agent, or Firm* — Patterson & Sheridan, LLP

(57) ABSTRACT

A method of manufacturing a semiconductor device includes: providing, on a substrate, a first magnetic substrate including a base, a first side wall portion and a second side wall portion at opposed ends of the base, the sidewall portions extending from the base, providing a semiconductor chip over the base at a location between the first side wall portion and the second side wall portion, providing a plate-like magnetic substrate having a second surface, the second surface provided with a resin thereon, and positioning the plate-like magnetic substrate having a second surface with the resin thereon such that the second surface faces the base of the first magnetic substrate. Then the plate like magnetic substrate is moved in the direction of the first magnetic substrate to contact the second surface of the plate like magnetic substrate with the first side wall portion and the second side wall portion.

9 Claims, 7 Drawing Sheets

(51) Int. Cl.
*H01L 23/31* (2006.01)
*H01L 23/29* (2006.01)
*H01L 21/78* (2006.01)
*H01L 21/56* (2006.01)
*H01L 23/13* (2006.01)
*H01L 43/02* (2006.01)
*H01L 43/08* (2006.01)

(52) U.S. Cl.
CPC ........ *H01L 23/295* (2013.01); *H01L 23/3121* (2013.01); *H01L 24/32* (2013.01); *H01L 24/48* (2013.01); *H01L 24/73* (2013.01); *H01L 24/83* (2013.01); *H01L 43/02* (2013.01); *H01L 43/08* (2013.01); *H01L 2224/32245* (2013.01); *H01L 2224/48091* (2013.01); *H01L 2224/48106* (2013.01); *H01L 2224/48245* (2013.01); *H01L 2224/73265* (2013.01); *H01L 2224/83192* (2013.01); *H01L 2225/0651* (2013.01); *H01L 2924/1443* (2013.01)

(58) Field of Classification Search
CPC ... H01L 21/78; H01L 23/295; H01L 23/3121; H01L 24/48; H01L 2924/1443; H01L 43/02; H01L 2224/83192; H01L 2224/48245; H01L 2224/48106; H01L 2224/73265; H01L 2224/32245; H01L 2224/48091; H01L 2225/0651; H01L 43/08

See application file for complete search history.

(56) References Cited

U.S. PATENT DOCUMENTS

| | | | |
|---|---|---|---|
| 2010/0164077 A1* | 7/2010 | Bando | H01L 23/49503 257/659 |
| 2014/0225208 A1* | 8/2014 | Gu | H01L 43/02 257/422 |
| 2015/0069545 A1* | 3/2015 | Noma | H01L 23/552 257/421 |

FOREIGN PATENT DOCUMENTS

| | | |
|---|---|---|
| JP | 2008-218496 A | 9/2008 |
| JP | 2009-182124 A | 8/2009 |

* cited by examiner

SEMICONDUCTOR DEVICE AND METHOD OF MANUFACTURING THE SAME

CROSS-REFERENCE TO RELATED APPLICATION

This application is based upon and claims the benefit of priority from. Japanese Patent Application No. 2016-065743, filed Mar. 29, 2016, the entire contents of which are incorporated herein by reference.

FIELD

Embodiments relate to a semiconductor device and a method of manufacturing the same.

BACKGROUND

When a semiconductor chip is affected by a magnetic field from the exterior thereof, noise is generated during chip operation. Therefore, in order to protect the semiconductor chip from the external magnetic field, two magnetic substrates having high magnetic permeability are prepared and arranged so as to extend around the semiconductor chip.

DETAILED DESCRIPTION

An exemplary embodiment provides a method of manufacturing a semiconductor device capable of easily sealing a semiconductor chip.

In general, according to one embodiment, a method of manufacturing a semiconductor device includes: providing, on a substrate, a first magnetic substrate including a base, a first side wall portion and a second side wall portion disposed at opposed ends of the base, the sidewall portions extending from the base, providing a semiconductor chip over the base of the first magnetic substrate at a location between the first side wall portion and the second side wall portion, providing a plate-like magnetic substrate having a second surface, the second surface provided with a resin thereon, and positioning the plate-like magnetic substrate having a second surface with the resin thereon such that the second surface faces the base of the first magnetic substrate. Then the plate like magnetic substrate is moved in the direction of the first magnetic substrate to contact the second surface of the plate like magnetic substrate with the first side wall portion and the second side wall portion.

First Embodiment

Figure 1:
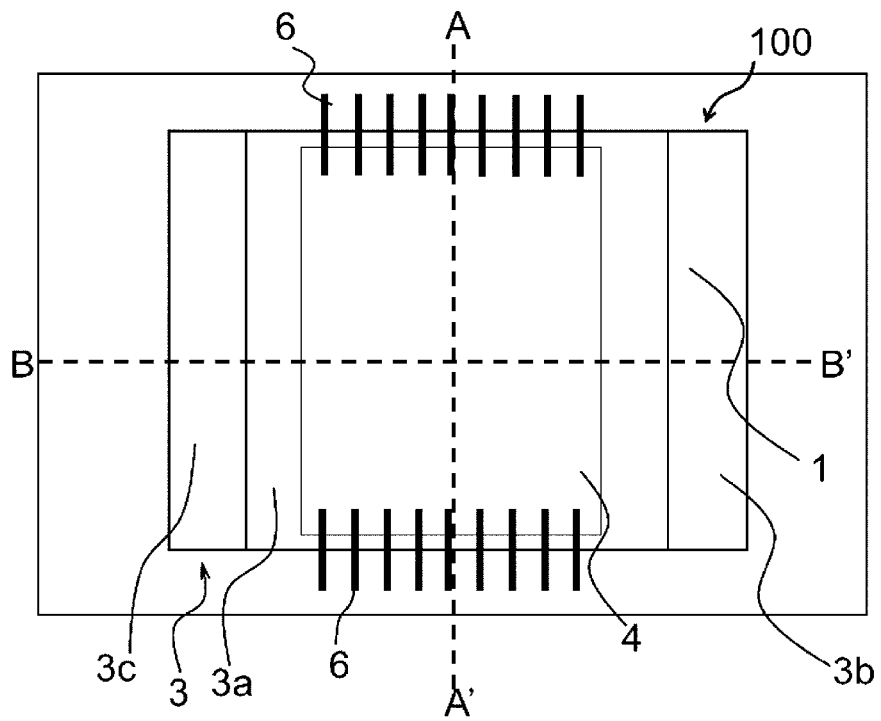
FIG. 1 is a cross-sectional view of a semiconductor device according to a first embodiment.
Figure 2:
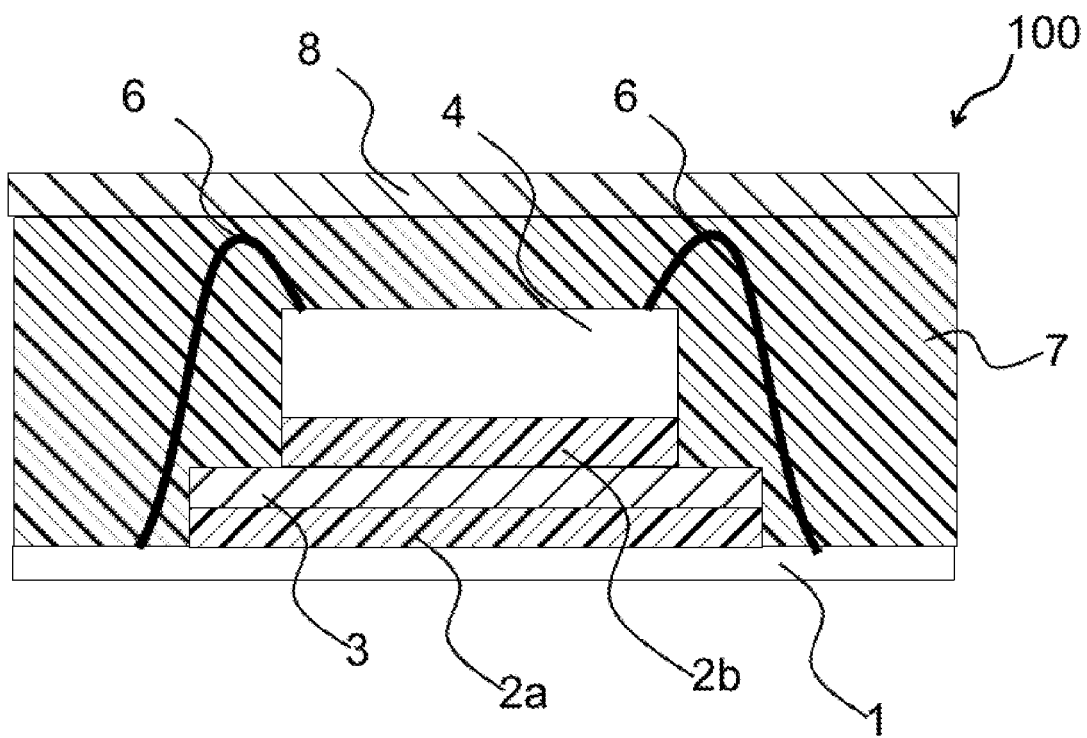
FIG. 2 is a cross-sectional view of the semiconductor device according to the first embodiment.
Figure 3:
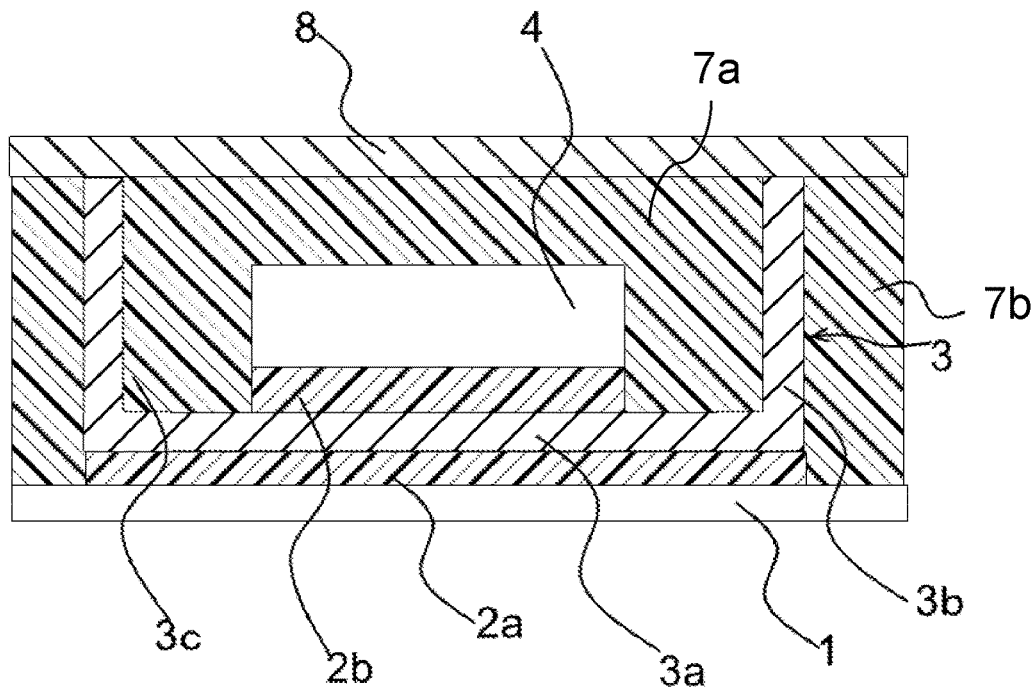
FIG. 3 is a cross-sectional view of the semiconductor device according to the first embodiment.

A semiconductor device according to a first embodiment will be described with reference to FIGS. 1 and 2. FIG. 1 is a sectional view showing a semiconductor device according to a first embodiment. In FIG. 1, an upper magnetic plate and a resin provided over a semiconductor chip are omitted. FIG. 2 is a cross-sectional view of the semiconductor device taken along the line A-A' in FIG. 1. FIG. 3 is a cross-sectional view of the semiconductor device taken along the line B-B' in FIG. 1. Here, the directions of the lines A-A' and B-B' are, for example, orthogonal to each other. Further, in the embodiment, the direction of the line A-A' is referred to as the longitudinal direction, and the direction of the line B-B' is referred to as the width direction.

As shown in FIGS. 1, 2 and 3, a semiconductor device 100 according to the embodiment includes a substrate 1, a U-shaped magnetic substrate 3 fixed to the substrate 1 with an adhesive film 2a, and a semiconductor chip 4 provided over the U-shaped magnetic substrate 3.

The substrate 1 has a rectangular shape with a first direction being the longitudinal direction and a second direction being the width direction. An insulating material such as ceramic, resin, or silicon (Si) having an oxidized surface, is used as the substrate 1. Wiring (not shown) and contact portions connected to the wiring are formed on the surface of the substrate 1. Respective contact portions are formed with a predetermined space therebetween in the width direction. The wiring and the contact portions are formed by printing, vapor deposition or another method, using a metal such as copper.

The U-shaped magnetic substrate (lower shield plate) 3 has a rectangular base 3a, and has side wall portions 3b and 3c opposed to each other at the end portions of the base 3a (FIG. 3). The heights and the widths of the side wall portions 3b, 3c are substantially the same. As the U-shaped magnetic substrate, in the embodiment, the base 3a and side wall portions 3b and 3c are formed by bending a plate of a magnetic alloy into the U-shape.

A material having high magnetic permeability, for example, a magnetic alloy containing iron such as a PC permalloy (Ni—Mo, Cu—Fe) is used for the U-shaped magnetic substrate. It is noted that, in the embodiment, the thickness of the U-shaped magnetic substrate 3 is about 50 µm to 150 µm.

The semiconductor chip 4 includes an integrated circuit, and in the embodiment, for example, a storage device that magnetically stores a plurality of data is mounted thereon. For example, the storage device may write data by spin injection, and discriminate data written by a change in resistance due to a tunnel magnetic resistance effect. However, a different storage device may be mounted as a semiconductor chip, or a configuration other than a storage device may be mounted. The semiconductor chip 4 has dimensions substantially equal to or narrower than that of the base 3a of the U-shaped magnetic substrate 3 in the longitudinal direction and the width direction.

The semiconductor chip 4 is fixed to the base 3a of the U-shaped magnetic substrate 3 by an adhesive film 2b. The semiconductor chip 4 has a span equal to or less than that of the base 3a of the U-shaped magnetic substrate 3 in the longitudinal direction and the width direction. A plurality of bonding wires 6 are provided on the upper surface of the semiconductor chip 4, and one end of each of the bonding wires 6 is connected to the semiconductor chip 4. The other end of each bonding wires 6 is connected to the contact portion of the substrate 1. Therefore, the semiconductor chip 4 is electrically connected to the substrate 1. The plurality of bonding wires 6 are provided, for example, side by side in the width direction.

A plate-like magnetic substrate 8 is provided above the U-shaped magnetic substrate 3 and is in contact with the uppermost surface of the side wall portions 3b and 3c. The material of the plate-like magnetic substrate 8 is, for example, the same as that of the U-shaped magnetic substrate. Therefore, the width and the thickness of the plate-like magnetic substrate 8 in the longitudinal direction and the width direction are substantially the same as those of the U-shaped magnetic substrate 3.

The plate-like magnetic substrate (upper shield plate) 8 extends above the upper surface of the semiconductor chip 4. On the other hand, the U-shaped magnetic substrate 3 extends below and to the sides of the side surface and the lower surface of the semiconductor chip 4. Further, the width of the semiconductor chip 4 is substantially equal to or smaller than those of the plate-like magnetic substrate 8 and the U-shaped magnetic substrate. Therefore, the plate-like magnetic substrate 8 and the U-shaped magnetic substrate 3 surround (extend around) and suitably protect the main portion of the semiconductor chip 4 from an external magnetic field.

A sealing film 7a seals the region between the U-shaped magnetic substrate 3 and the plate-like magnetic substrate 8. Further, a sealing film 7b seals the region outside the U-shaped magnetic substrate 3 and between the substrate 1 and the plate-like magnetic substrate 8. Thus, the semiconductor chip 4 and the bonding wires 6 can be fixed and protected.

[Method of Manufacturing Semiconductor Device According to First Embodiment]

Figure 4:
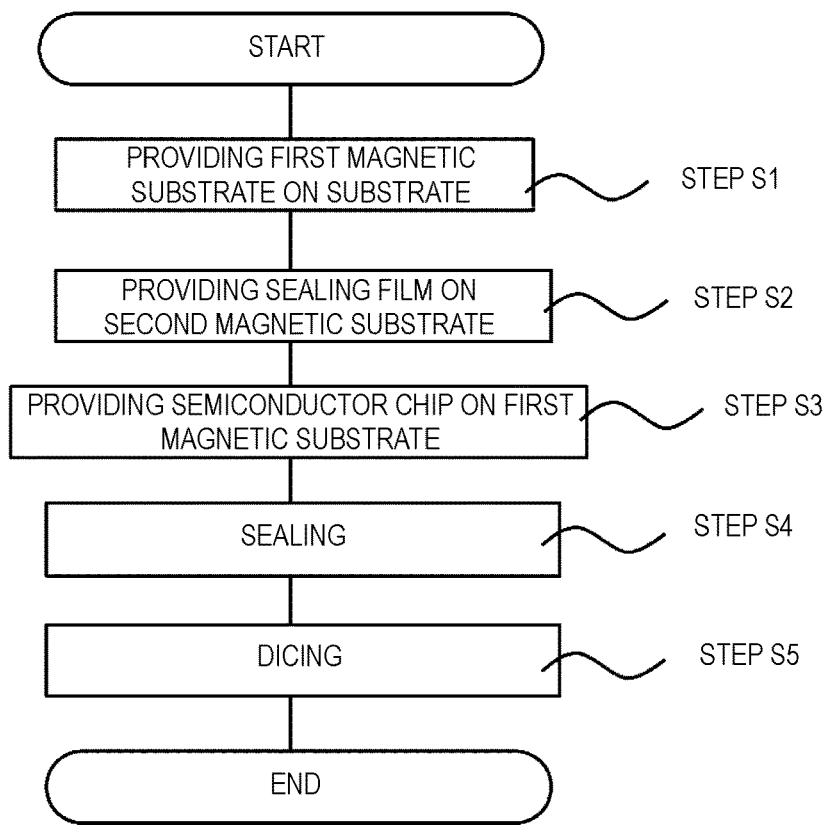
FIG. 4 is a flow chart showing a flow of a manufacturing process of the semiconductor device according to the first embodiment.

Next, a method of manufacturing the semiconductor device according to the embodiment will be described. FIG. 4 is a flow chart showing steps in a method of manufacturing a semiconductor device according to the embodiment. FIGS. 5 to 9 are cross-sectional views showing a part of a manufacturing process of the semiconductor device according to the embodiment.

Figure 5:
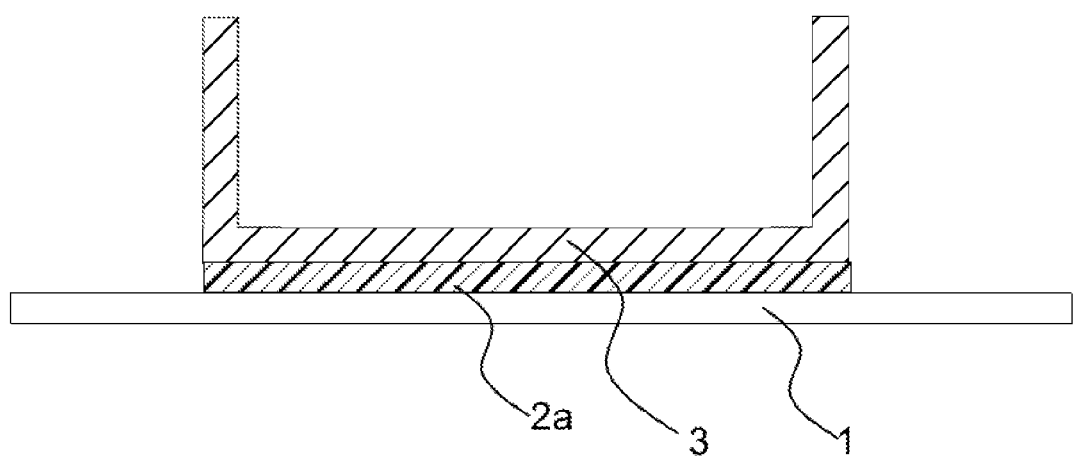
FIG. 5 is a cross-sectional view of the result of a part of the manufacturing process of the semiconductor device according to the first embodiment.

In the method of manufacturing a semiconductor device according to the embodiment, as shown in FIG. 5, contact portions are first formed on the substrate 1, and the U-shaped magnetic substrate 3 is provided on the substrate 1. The U-shaped magnetic substrate 3 is fixed to the substrate 1 with the adhesive film 2a.

Figure 6:
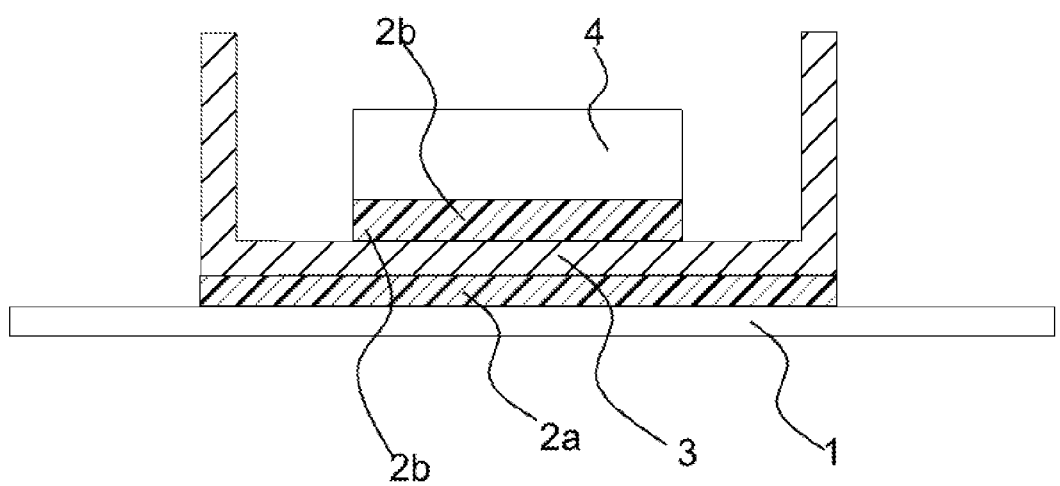
FIG. 6 is a cross-sectional view of the result of a part of the manufacturing process of the semiconductor device according to the first embodiment.

As shown in FIG. 6, the semiconductor chip 4 is provided on the U-shaped magnetic substrate 3. The semiconductor chip 4 is fixed on the U-shaped magnetic substrate 3 with the adhesive film 2b.

Figure 7:
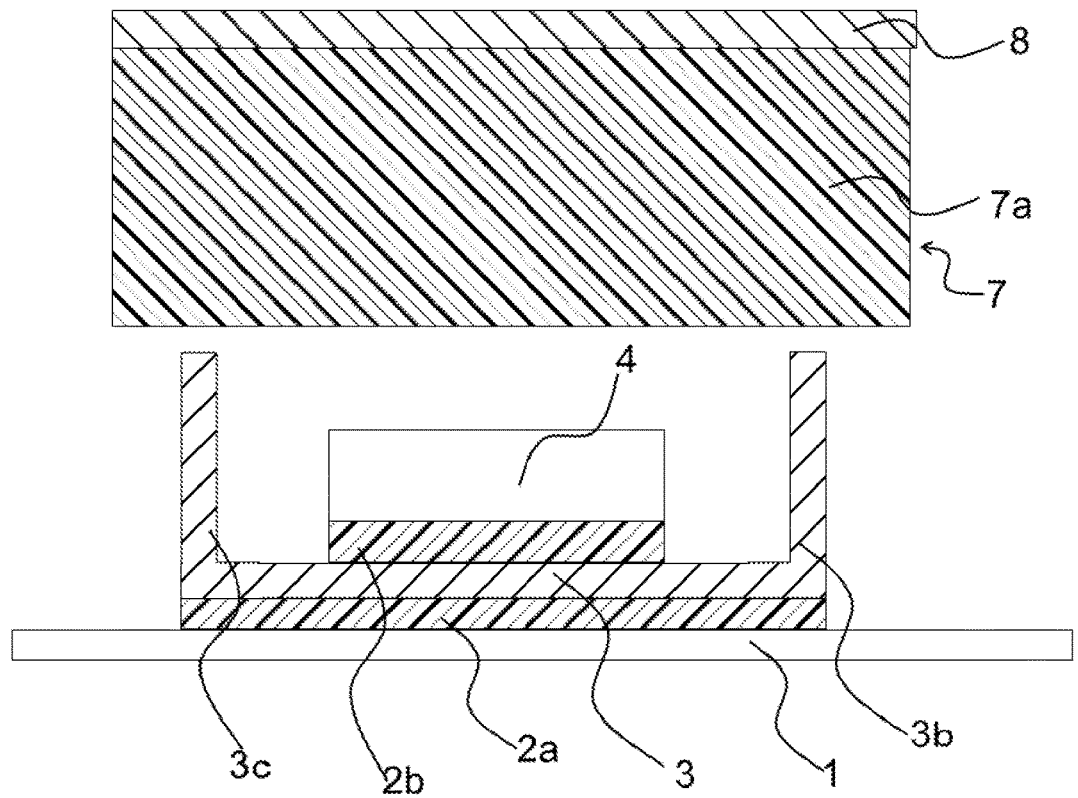
FIG. 7 is a cross-sectional view of the result of a part of the manufacturing process of the semiconductor device according to the first embodiment.

As shown in FIG. 7, the sealing film 7 is provided on the plate-like magnetic substrate 8. The lengths of the sides in the longitudinal direction and the width direction of the plate-like magnetic substrate 8 are longer than the lengths of the sides in the longitudinal direction and the width direction of the base 3a of the U-shaped magnetic substrate 3. The U-shaped magnetic substrate 3 is adhered to the adhesive of the sealing film 7 which will be described later.

The sealing film 7 contains, for example, an epoxy resin as a thermosetting resin, an acrylic resin as a thermoplastic resin, and $SiO_2$ as a filler. The sealing film 7 contains, for example, 30 weight percent of an epoxy resin, 20 weight percent of an acrylic resin, and 50 weight percent of a filler.

In the embodiment, the thickness of the sealing film 7 is substantially uniform on the plate-like magnetic substrate, but a distribution may be present. In this case, it is required that the sealing film 7 is wider than the region corresponding to the bottom portion 3a and is thicker than the heights of the side wall portions 3b and 3c, at minimum. Thus, the semiconductor chip 4 can be sealed. Here, the heights of the side wall portions 3b and 3c refer to the height from the bottom surface of the U-shaped magnetic substrate 3 in contact with the adhesive film 2a.

Figure 8:
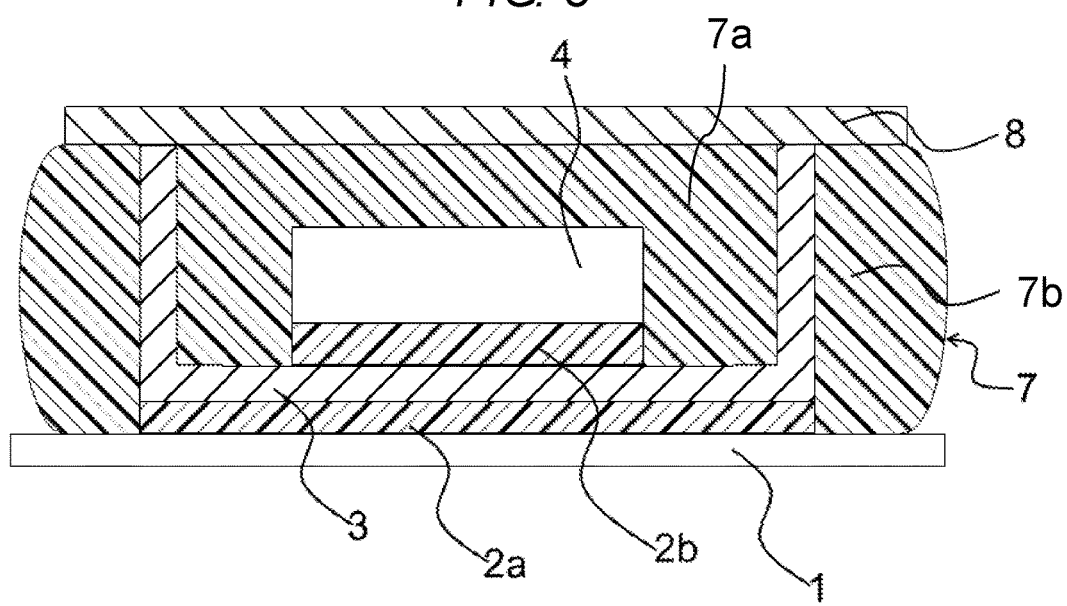
FIG. 8 is a cross-sectional view of the result of apart of the manufacturing process of the semiconductor device according to the first embodiment.

As shown in FIG. 8, the plate-like magnetic substrate 8 provided with the sealing film 7 is positioned above the U-shaped magnetic substrate 3 with the sealing film facing the U-shaped magnetic substrate 3, and then, the plate-like magnetic substrate 8 is brought into contact with the side wall portions 3b and 3c in order to seal the semiconductor chip 4 therebetween. That is, the magnetic substrate 8 is mounted in contact with the side wall portions 3b and 3c. As a result, after the plate-like magnetic substrate 8 is brought into contact with the side wall portions 3b and 3c, a protruding portion 7c of the sealing film 7 is formed extending from the outer sides of the plate-like magnetic substrate 8.

Figure 9:
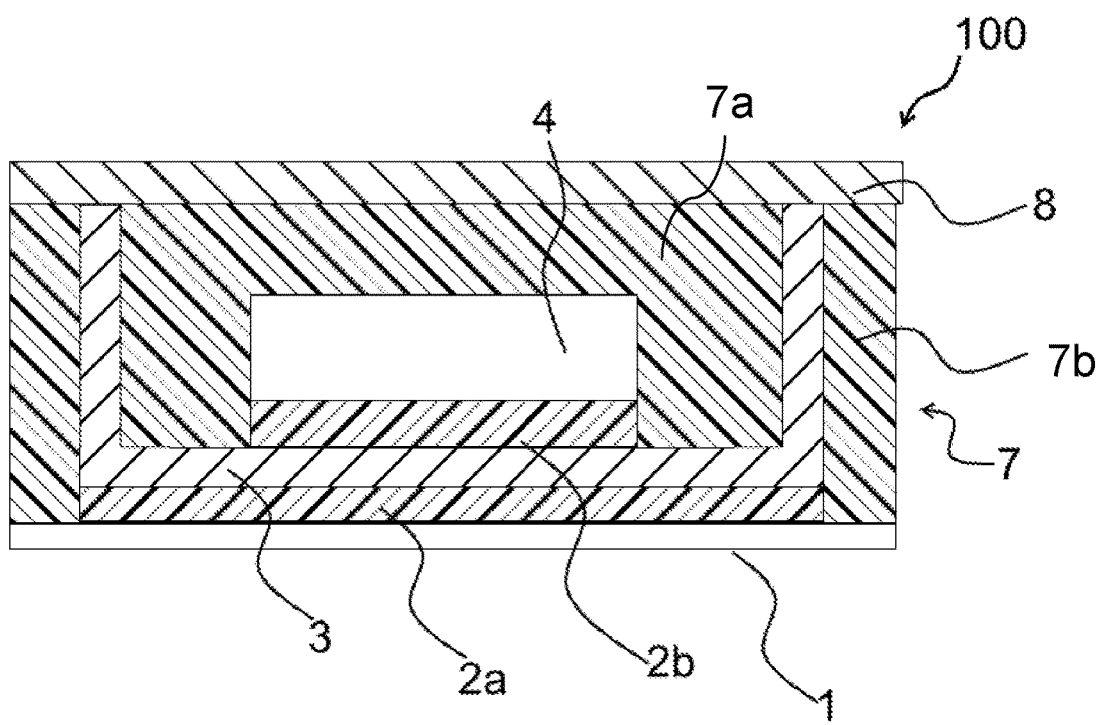
FIG. 9 is a cross-sectional view of the result of a part of the manufacturing process of the semiconductor device according to the first embodiment.

As shown in FIG. 9, after the sealing film is cured, the protruding portion 7c, the plate-like magnetic substrate 8 and the substrate 1 are diced to singulate the semiconductor device 100.

A comparative example will now be described.

Figure 15:
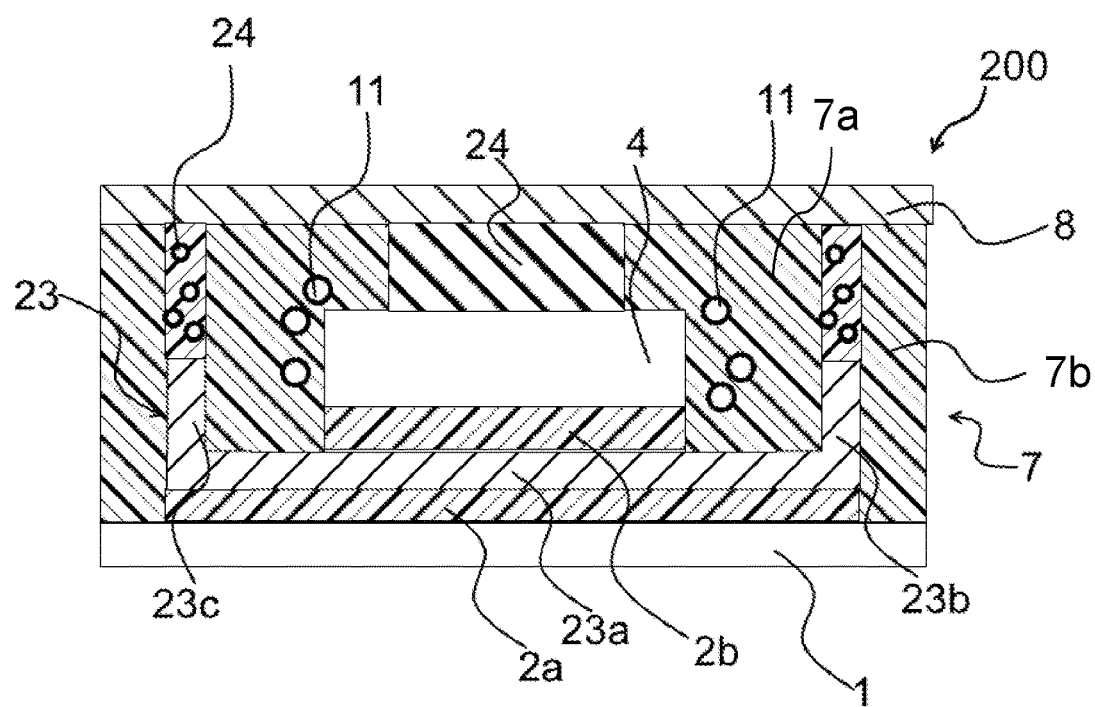
FIG. 15 is a cross-sectional view of a semiconductor device of a comparative example.

FIG. 15 is a cross-sectional view showing a part of a method of manufacturing a semiconductor device according to the comparative example. As shown in FIG. 15, in the method of manufacturing of the semiconductor device according to the comparative example, a U-shaped magnetic substrate 23 having side wall portions 23b, 23c having heights lower than the thickness of a semiconductor chip is provided, and the semiconductor chip 4 is provided on the U-shaped magnetic substrate 23. Next, a resin containing magnetic particles 24 is applied to the upper portions of the side wall portions 23b, 23c, a plate-like magnetic substrate is provided on the resin, and then, the resin is cured. After the plate-like magnetic substrate is provided, a sealing resin is applied from between the semiconductor chip and the side wall portions 23b, 23c of the U-shaped substrate. However, due to the presence of the bonding wires, the sealing resin cannot be sufficiently filled, thus, a void 11 may occur. The occurrence of the void 11 causes a reduction in the reliability of the bonding between the semiconductor chip 4 and the substrate.

According to the method of manufacturing the semiconductor device according to the embodiment, the U-shaped magnetic substrate 3 is provided, the semiconductor chip 4 is provided on the U-shaped magnetic substrate 3, and the plate-like magnetic substrate 8 provided with the sealing film 7 thicker than the heights of the side wall portions 3b and 3c of the U-shaped substrate 3 is provided above the U-shaped magnetic substrate 3 and the semiconductor chip 4, thus, a semiconductor device is formed.

(1) Therefore, as compared with the comparative example, there is no need to apply the sealing film 7 into the space formed between the semiconductor chip 4 and the side wall portions 4b, 4c after the semiconductor chip 4 is provided in the semiconductor device, and sealing is easy.

(2) In addition, since there is no need to apply the sealing film 7 into the space formed between the semiconductor chip 4 and the side wall portions of the U-shaped magnetic substrate 3, no void 11 occurs.

(3) Further, as compared with the comparative example, since there is no need to seal the entire semiconductor device, including the bonding wires connected to the substrate, with a resin after the sealing film is applied between the semiconductor chip and the side surfaces of the U-shaped magnetic substrate, it is possible to reduce the thickness of the entire device by the amount of the resin that seals the entire semiconductor device. That is, it is possible to reduce the size of the semiconductor device.

(4) In the embodiment, as compared with the comparative example, there is no need for fixing the U-shaped magnetic substrate and the plate-like magnetic substrate with an adhesive containing a high magnetic material since the side wall portions 3b and 3c of the U-shaped magnetic substrate 3 are in directly contact with the plate-like magnetic substrate 8. Further, as compared with the comparative example, it is possible to more stably connect the U-shaped magnetic substrate and the plate-like magnetic substrate. Thus, the magnetic shielding effect for protecting the semiconductor chip 4 can be enhanced.

It is noted that, in the embodiment, a magnetic alloy containing iron is used for the U-shaped magnetic substrate 3 and the plate-like magnetic substrate 8, but not limited thereto. For example, a magnetic alloy containing nickel or cobalt may be used.

Second Embodiment

Next, a method of manufacturing the semiconductor device according to a second embodiment will be described. In the first embodiment, a method of individually manufacturing a semiconductor device by sealing one semiconductor chip is shown, but in the present embodiment, a method of manufacturing a plurality of semiconductor devices by simultaneously sealing a plurality of semiconductor chips will be described.

Figure 10:
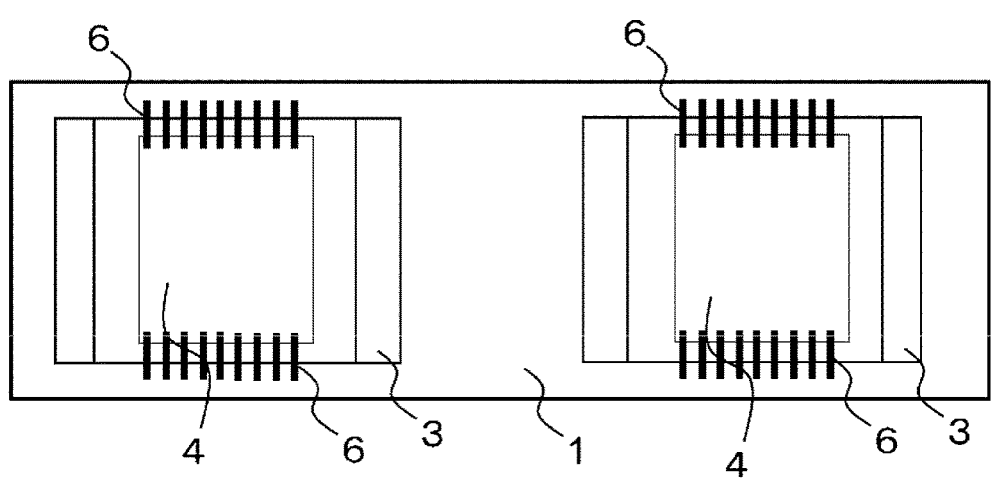
FIG. 10 is a plan view of a plurality of semiconductor device according to a second embodiment.

FIG. 10 is a sectional plan view of a plurality of semiconductor devices according to the second embodiment. In FIG. 10, a plate-like magnetic substrate and a sealing film provided above the semiconductor chip 4 are omitted. FIGS. 11 to 14 are cross-sectional views of the result of a part of a method of manufacturing a semiconductor device according to the second embodiment. As shown in the figures, a second magnetic substrate is provided on the substrate.

Figure 11:
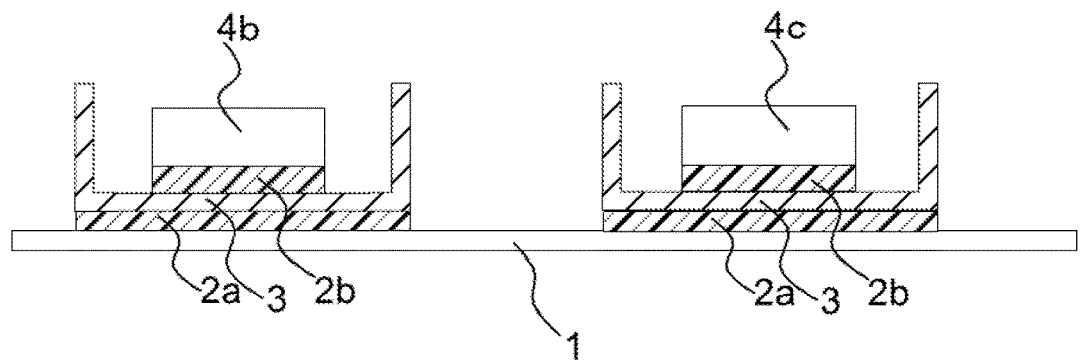
FIG. 11 is a cross-sectional view of the result of a part of a manufacturing process of the semiconductor device according to the second embodiment.

First, as shown in FIGS. 10 and 11, two U-shaped magnetic substrates 3 are arranged side by side on the substrate 1 in the width direction. Each of the U-shaped magnetic substrates 3 is provided in the same manner as in the first embodiment. Next, a semiconductor chip 4b and a semiconductor chip 4c are secured on the base of each U-shaped magnetic substrate 3 with an adhesive 2b. The semiconductor chip 4b and the semiconductor chip 4c have the same configuration as, for example, that of the semiconductor chip 4a, but a different configuration may be possible. Further, the semiconductor chips 3b and 4c are provided by using the same manner as in the first embodiment.

Figure 12:
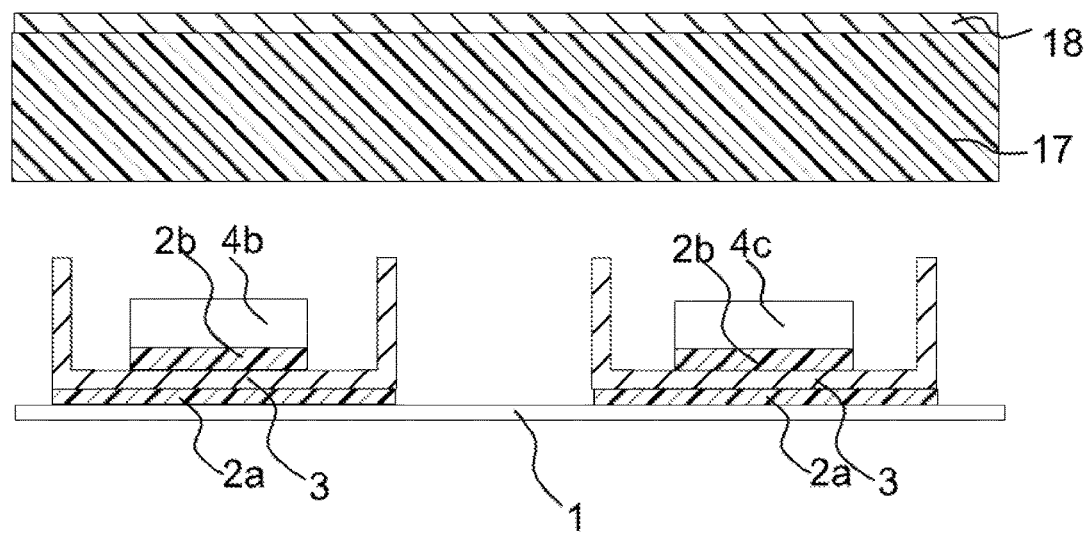
FIG. 12 is a cross-sectional view of the result of a part of the manufacturing process of the semiconductor device according to the second embodiment.

Next, as shown in FIG. 12, a second plate-like magnetic substrate 18 provided with a sealing film 17 is prepared. The width in the width direction of the second magnetic substrate 18 is at least larger than the sum of the widths in the width direction of the two U-shaped magnetic substrates. The sealing film 17 is the same as the sealing film 7 according to the first embodiment.

Figure 13:
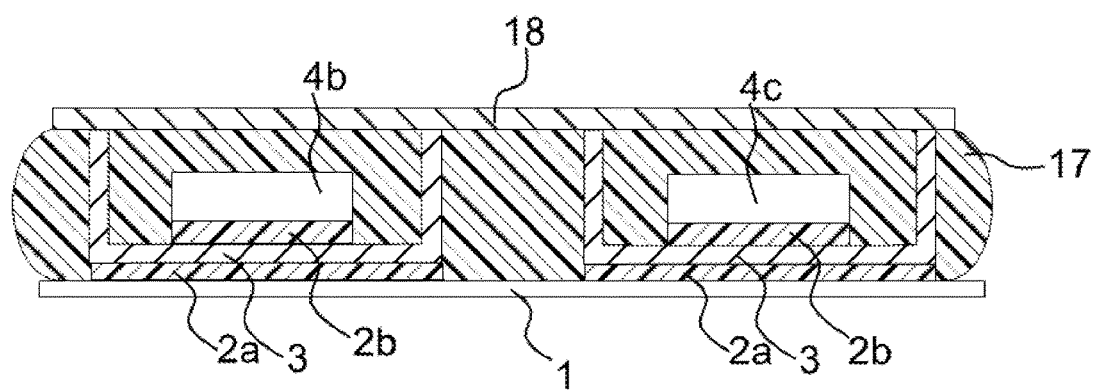
FIG. 13 is a cross-sectional view of the result of a part of the manufacturing process of the semiconductor device according to the second embodiment.

Next, as shown in FIG. 13, a plurality of semiconductor chips 4, bonding wires 6 and the like are sealed with the sealing film 17. When a plurality of semiconductor chips 4, the bonding wires 6 and the like are sealed, the second magnetic substrate 18 is brought into contact with and fixed to the respective side wall portions 3b and 3c. The sealing film 17 is then cured.

Figure 14:
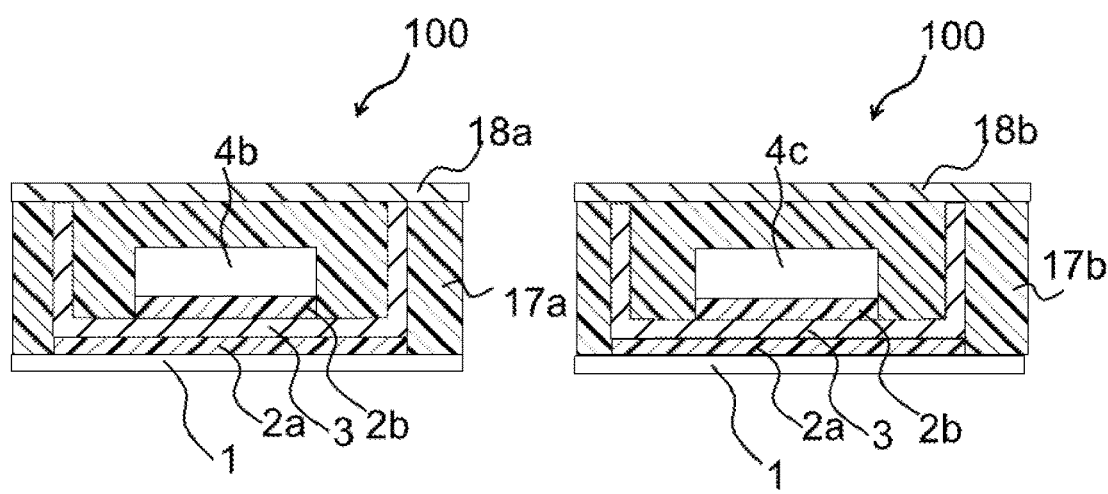
FIG. 14 is a cross-sectional view of the result of a part of the manufacturing process of the semiconductor device according to the second embodiment.

Next, as shown in FIG. 14, the end portion of the plate-like magnetic substrate and each of the U-shaped magnetic substrates are singulated to manufacture semiconductor devices.

According to the method of manufacturing the semiconductor device according to the embodiment, after the sealing film 17 is provided on the second plate-like magnetic substrate 18 having a width equal to or larger than two semiconductor chips, a plurality of semiconductor chips are sealed at the same time by using the second plate-like magnetic substrate 18 and the sealing film 17, thus, the number of processing stages is reduced, as compared with the method of manufacturing the semiconductor according to the first embodiment. That is, it is possible to reduce the number of the stages of providing the plate-like magnetic substrate and the number of dicing for each semiconductor chip.

It is noted that, in the embodiment, the two semiconductor chips 4 are sealed using the sealing film 17, but three or more semiconductor chips may be sealed at the same time. In this case, for example, the second magnetic substrate 18 having a width corresponding to that of the semiconductor chip 4 and the bottom portion 3a of the U-shaped magnetic substrate 3 is used.

In the case where the widths of the bottom portions 3a of the plurality of U-shaped magnetic substrates 3 are different from each other, the second plate-like magnetic substrate 18 having a width equal to or larger than the sum of the widths of the bottom portions 3a of the respective U-shaped magnetic substrates 3 is used.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a substrate;
   a first magnetic substrate comprising a base, a first side wall portion, and a second side wall portion, the first and second side wall portions extending in a first direction from the base, the base having a first end and a second end along a second direction perpendicular to the first direction, the first and the second side wall portions being at the first and second ends of base, respectively;
   a semiconductor chip located above the base of the first magnetic substrate in the first direction and between the first and second side wall portions in the second direction and no portions of the first magnetic substrate being disposed on either side of the semiconductor chip in a third direction orthogonal to the first and second directions;
   a second magnetic substrate above the first magnetic substrate in the first direction and in direct contact with an upper end of the first side wall portion and an upper end of the second side wall portion;
   a wire connecting the semiconductor chip and the substrate; and
   a sealing material between the second magnetic substrate and the semiconductor chip, between the first and second side wall portions in the second direction, and between the second magnetic substrate and the substrate at a position beyond the first end of the first magnetic substrate in the second direction, the sealing material sealing the semiconductor chip and the wire.

2. The semiconductor device according to claim 1, wherein the sealing material includes a resin.

3. The semiconductor device according to claim 1, further comprising a first adhesive extending between the semiconductor chip and the first magnetic substrate.

4. The semiconductor device according to claim 3, wherein the height of the first side wall portion and the second side wall portion extending from the base of the first magnetic substrate is greater than the thickness of the semiconductor chip and the first adhesive.

5. The semiconductor device according to claim 1, wherein
   the sealing material contacts the first and the second side wall portions, the base of the first magnetic substrate, and a surface of the second magnetic substrate facing the base of the first magnetic substrate.

6. The semiconductor device according to claim 1, wherein the first and the second magnetic substrate form a magnetic element extending around the semiconductor chip.

7. The semiconductor device according to claim 1, wherein the first magnetic substrate is U-shaped.

8. The semiconductor device according to claim 1, wherein
   the first magnetic substrate is a bent metal plate,
   the first and second side wall portions are continuous over a length of the base in the third direction.

9. The semiconductor device according to claim 1, wherein the semiconductor chip as first end face facing the first end of the first magnetic substrate in the second direction, a second end face facing the second end of the first magnetic substrate in the second direction, and a third end face between the first end face and the second end face in the second direction, the third end face facing no magnetic material in the third direction.

* * * * *